United States Patent
Suzuki et al.

(10) Patent No.: US 9,373,498 B2
(45) Date of Patent: Jun. 21, 2016

(54) METHOD OF OPERATING VERTICAL HEAT TREATMENT APPARATUS, VERTICAL HEAT TREATMENT APPARATUS AND NON-TRANSITORY RECORDING MEDIUM

(71) Applicant: TOKYO ELECTRON LIMITED, Minato-Ku, Tokyo (JP)

(72) Inventors: Keisuke Suzuki, Nirasaki (JP); Yutaka Motoyama, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 155 days.

(21) Appl. No.: 14/228,930

(22) Filed: Mar. 28, 2014

(65) Prior Publication Data

US 2014/0295676 A1  Oct. 2, 2014

(30) Foreign Application Priority Data

Mar. 29, 2013  (JP) .................................. 2013-072831

(51) Int. Cl.
  *H05H 1/24*  (2006.01)
  *H01L 21/02*  (2006.01)
  *H01L 21/67*  (2006.01)
  (Continued)

(52) U.S. Cl.
  CPC ...... *H01L 21/02274* (2013.01); *C23C 16/4404* (2013.01); *C23C 16/4405* (2013.01); *C23C 16/45542* (2013.01); *H01L 21/0217* (2013.01); *H01L 21/0228* (2013.01); *H01L 21/02211* (2013.01); *H01L 21/67109* (2013.01)

(58) Field of Classification Search
  CPC ..................... H01L 21/0228; H01L 21/02274; H01L 21/02301; C23C 16/4404; C23C 16/4405; C23C 16/45542
  USPC ......................................................... 427/569
  See application file for complete search history.

(56) References Cited

U.S. PATENT DOCUMENTS

2008/0311760 A1*  12/2008  Nodera ................. C23C 16/345
                                                  438/791
(Continued)

FOREIGN PATENT DOCUMENTS

| JP | 2002-280378 A | 9/2002 |
| JP | 2007-266297 A | 10/2007 |
| JP | 2008-053504 A | 3/2008 |

(Continued)

*Primary Examiner* — Kelly M Gambetta
(74) *Attorney, Agent, or Firm* — Nath Goldberg & Meyer; Jerald L. Meyer

(57) ABSTRACT

A method of operating vertical heat treatment apparatus includes: cleaning interior of vertical reaction chamber by supplying cleaning gas; pre-coating the interior of the reaction chamber by performing, a plurality of times, a cycle including alternately supplying the first gas and supplying the second gas while generating plasma from the second gas; eliminating charges by loading substrate holding unit holding a dummy semiconductor substrate or a conductive substrate into the reaction chamber and supplying the second gas while generating plasma from the second gas without supplying the first gas; loading the substrate holding unit holding a plurality of product semiconductor substrates into the reaction chamber; and forming thin film in the reaction chamber by performing, a plurality of times, a cycle including alternately supplying the first gas and supplying the second gas while generating plasma from the second gas.

4 Claims, 7 Drawing Sheets

(51) Int. Cl.
*C23C 16/44* (2006.01)
*C23C 16/455* (2006.01)

(56) References Cited

U.S. PATENT DOCUMENTS

2010/0212581 A1* 8/2010 Noro .................. C23C 16/0236
 117/97
2010/0304574 A1* 12/2010 Nodera ................ C23C 16/345
 438/791
2014/0187045 A1* 7/2014 Hua .................... H01L 21/0217
 438/694

FOREIGN PATENT DOCUMENTS

| JP | 2008-258210 A | 10/2008 |
| JP | 2009-076876 A | 4/2009 |
| JP | 2009-099919 A | 5/2009 |
| JP | 2009-170557 A | 7/2009 |
| KR | 10-2008-0108912 A | 12/2008 |
| KR | 10-2010-0095398 A | 8/2010 |

* cited by examiner

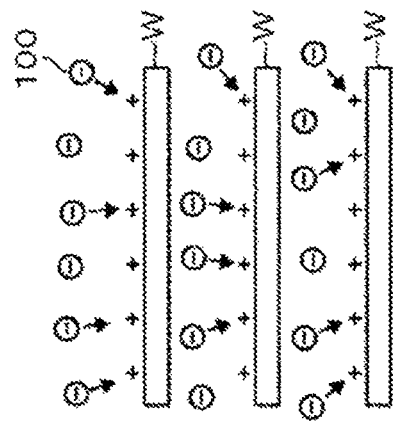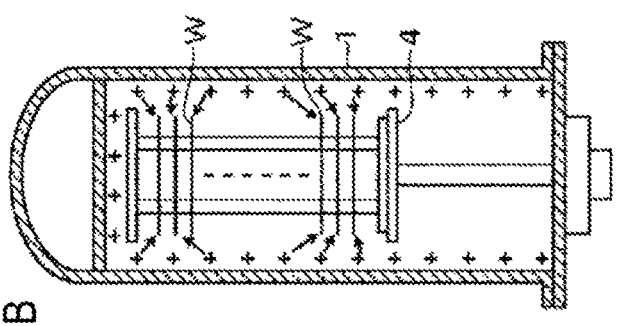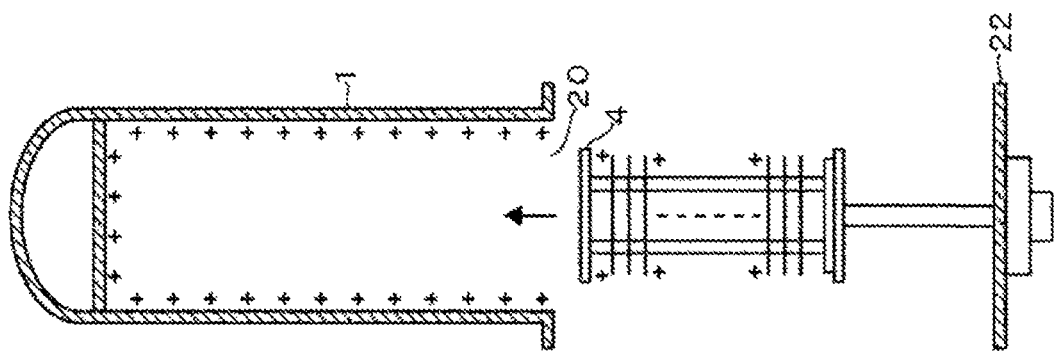

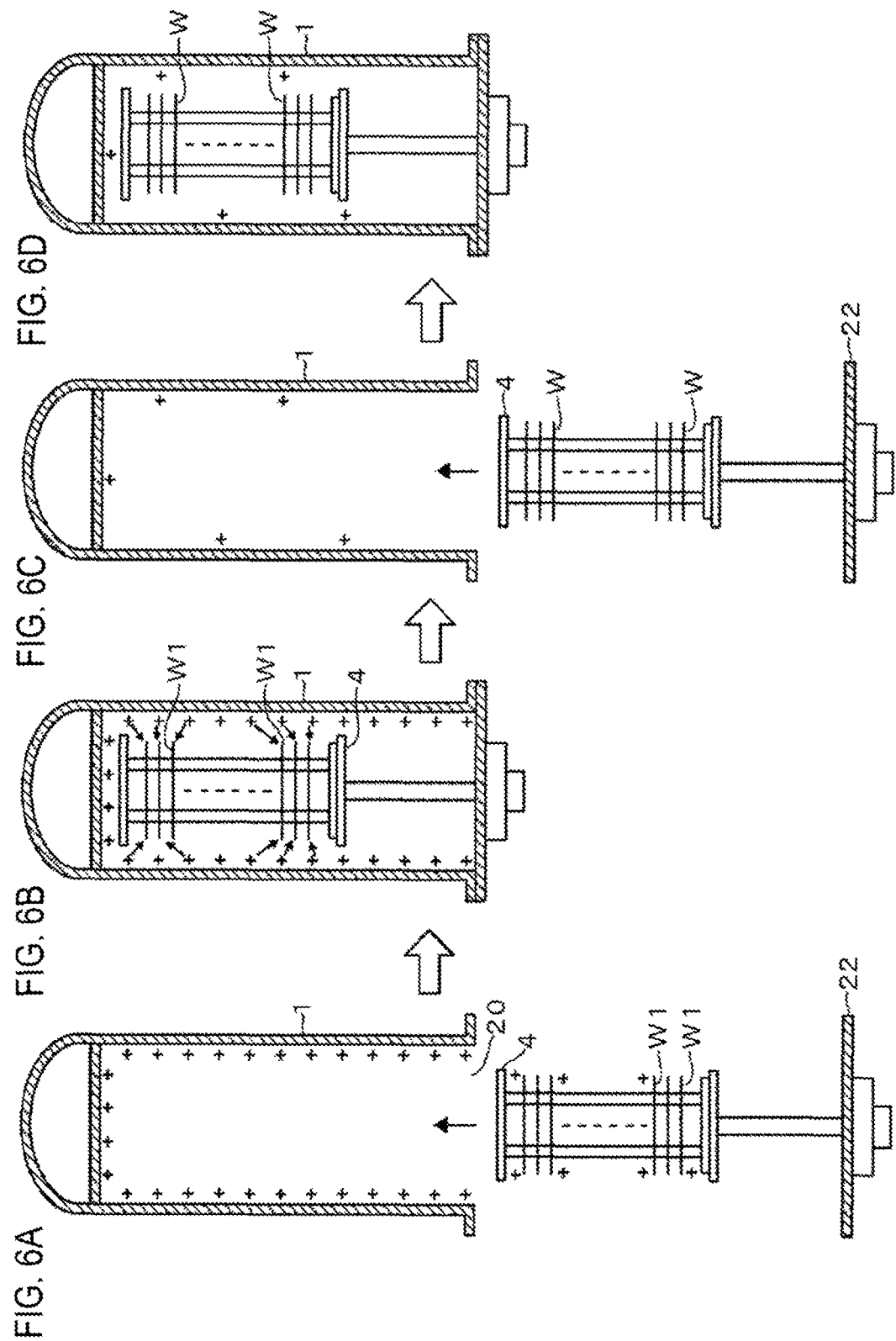

US 9,373,498 B2

METHOD OF OPERATING VERTICAL HEAT TREATMENT APPARATUS, VERTICAL HEAT TREATMENT APPARATUS AND NON-TRANSITORY RECORDING MEDIUM

CROSS-REFERENCE TO RELATED APPLICATION

This application claims the benefit of Japanese Patent Application No. 2013-072831, filed on Mar. 29, 2013, in the Japan Patent Office, the disclosure of which is incorporated herein in its entirety by reference.

TECHNICAL FIELD

The present disclosure relates to a method of operating a vertical heat treatment apparatus in which films are formed on a plurality of substrates held by a substrate holding unit, the vertical heat treatment apparatus, and a non-transitory recording medium storing a program for operating the vertical heat treatment apparatus.

BACKGROUND

In a process of manufacturing semiconductors, as an example of treatments for forming a film on a semiconductor wafer (hereinafter, referred to as a wafer), a treatment for laminating atomic layers or molecular layers of reaction products including a reasonable step for coverage (embedding property) of fine patterns or with a high compactness of a thin film is performed. Such a film forming treatment is performed by adsorbing a first gas onto a heated substrate, reacting a second gas with molecules of the first gas on the substrate, e.g., to nitride or oxidize the molecules, and repeating these processes a plurality of times.

In order to perform the film forming treatment on a plurality of wafers in clusters, a vertical heat treatment apparatus is used, and as an example thereof, there may be an example in which a silane-based gas and an ammonia gas are alternately supplied into a reaction chamber through gas nozzles different from each other to form silicon nitride films on the wafers. In addition, the ammonia gas is converted to plasma and supplied onto the wafers in order to reduce impurities in the reaction products by promoting the nitration of the silane-based molecules. Although a treatment is also known in which the ammonia gas is supplied without being converted to plasma, it is advantageous in that a heating temperature of the wafers can be lowered.

When such a film forming treatment is performed, thin films are formed on not only the wafers but also the interior of the reaction chamber. If a thickness of the film on the interior of the reaction chamber is increased, the film is peeled off to facilitate particle contamination. In this respect, if the thickness of the accumulated film exceeds a set value, the interior of the reaction chamber is cleaned with a cleaning gas. A fluorine-based gas is used as the cleaning gas, for example, when a silicon nitride film is to be formed. In addition, after the cleaning is performed, as the supply of the silane-based gas and the supply of the ammonia gas under plasma conditions are alternately repeated, a film forming treatment is performed so that a film having a predetermined thickness is formed on the inner wall of the reaction chamber. Such a treatment, which is referred to as pre-coating or the like, is performed in an initial film forming treatment on product wafers after the maintenance, in order to secure a stable film forming treatment by making a treatment atmosphere constant for a plurality of groups (or lots) of wafers.

However, if the film forming treatment is performed on the product wafers after the cleaning and the pre-coating is performed as described above, particle contamination occurs in the wafers of the first lot. On this account, the yield in the corresponding lot may become deteriorated.

SUMMARY

The present disclosure provides a method of operating a vertical heat treatment apparatus capable of reducing particle contamination after the interior of a reaction chamber is cleaned when a film forming treatment is performed by alternately supplying a raw material gas and a reaction gas to a substrate and by generating plasma from the reaction gas in the vertical heat treatment apparatus.

According to one aspect of the present disclosure, a method of operating a vertical heat treatment apparatus is provided. The vertical heat treatment apparatus including a first gas nozzle configured to supply a first gas, which is a raw material gas, and a second gas nozzle configured to supply a second gas, which is a reaction gas for reacting with molecules of the first gas to produce a reaction product. The method includes cleaning an interior of a vertical reaction chamber by supplying a cleaning gas into the reaction chamber, the reaction chamber being configured to interface with a heating unit; after cleaning the interior of the vertical reaction chamber, pre-coating the interior of the reaction chamber with a thin film by performing, a plurality of times, a cycle including alternately supplying the first gas into the reaction chamber through the first gas nozzle and supplying the second gas into the reaction chamber through the second gas nozzle while generating plasma from the second gas; eliminating charges, after cleaning the interior of the vertical reaction chamber, by loading a substrate holding unit in which a dummy semiconductor substrate or a conductive substrate is held in the reaction chamber and supplying the second gas into the reaction chamber through the second gas nozzle while generating plasma from the second gas without supplying the first gas into the reaction chamber; loading into the reaction chamber, after pre-coating the interior of the reaction chamber and eliminating the charges, the substrate holding unit in which a plurality of product semiconductor substrates are held; and forming a thin film in the reaction chamber after loading the substrate holding unit by performing, a plurality of times, a cycle including alternately supplying the first gas into the reaction chamber through the first gas nozzle and supplying the second gas into the reaction chamber through the second gas nozzle while generating plasma from the second gas.

According to another aspect of the present disclosure, provided is a vertical heat treatment apparatus, which includes a vertical reaction chamber to which a heating unit is provided; a first gas nozzle configured to supply a first gas, which is a raw material gas, into the reaction chamber; a second gas nozzle configured to supply a second gas, which is a reaction gas, for reacting with molecules of the first gas to produce a reaction product in the reaction chamber; a cleaning gas supply unit configured to supply a cleaning gas into the reaction chamber, and a control unit configured to output a control signal to perform: cleaning an interior of the reaction chamber by supplying the cleaning gas into the reaction chamber; after cleaning the interior of the reaction chamber, pre-coating the interior of the reaction chamber with a thin film by performing, a plurality of times, a cycle including alternately supplying the first gas into the reaction chamber through the first gas nozzle and supplying the second gas into the reaction chamber through the second gas nozzle while generating plasma from the second gas; eliminating charges, after cleaning the interior of the reaction chamber, by loading a substrate holding unit in which a dummy semiconductor substrate or a conductive substrate is held into the reaction chamber and supplying the second gas into the reaction chamber through the second gas nozzle while generating plasma from the second gas without supplying the first gas into the reaction chamber; and forming a thin film in the reaction chamber, after pre-coating the interior of the reaction chamber and eliminating the charges, by alternately performing a cycle a plurality of times in a state where the substrate holding unit in which a plurality of product semiconductor substrates are held is loaded into the reaction chamber, the cycle including alternately supplying the first gas into the reaction chamber and supplying the second gas into the reaction chamber while generating plasma from the second gas.

According to still another aspect of the present disclosure, provided is a non-transitory recording medium storing a computer program used in a vertical heat treatment apparatus for performing a heat treatment, after loading a substrate holding unit in which a plurality of substrates are held, into a vertical reaction chamber to which a heating unit is provided, wherein the computer program includes a group of steps configured to perform the method of operating the vertical heat treatment apparatus of the above-described aspect.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 5A to 5C are views illustrating a treatment process of a comparative example.

FIGS. 6A to 6D are views illustrating a treatment process of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
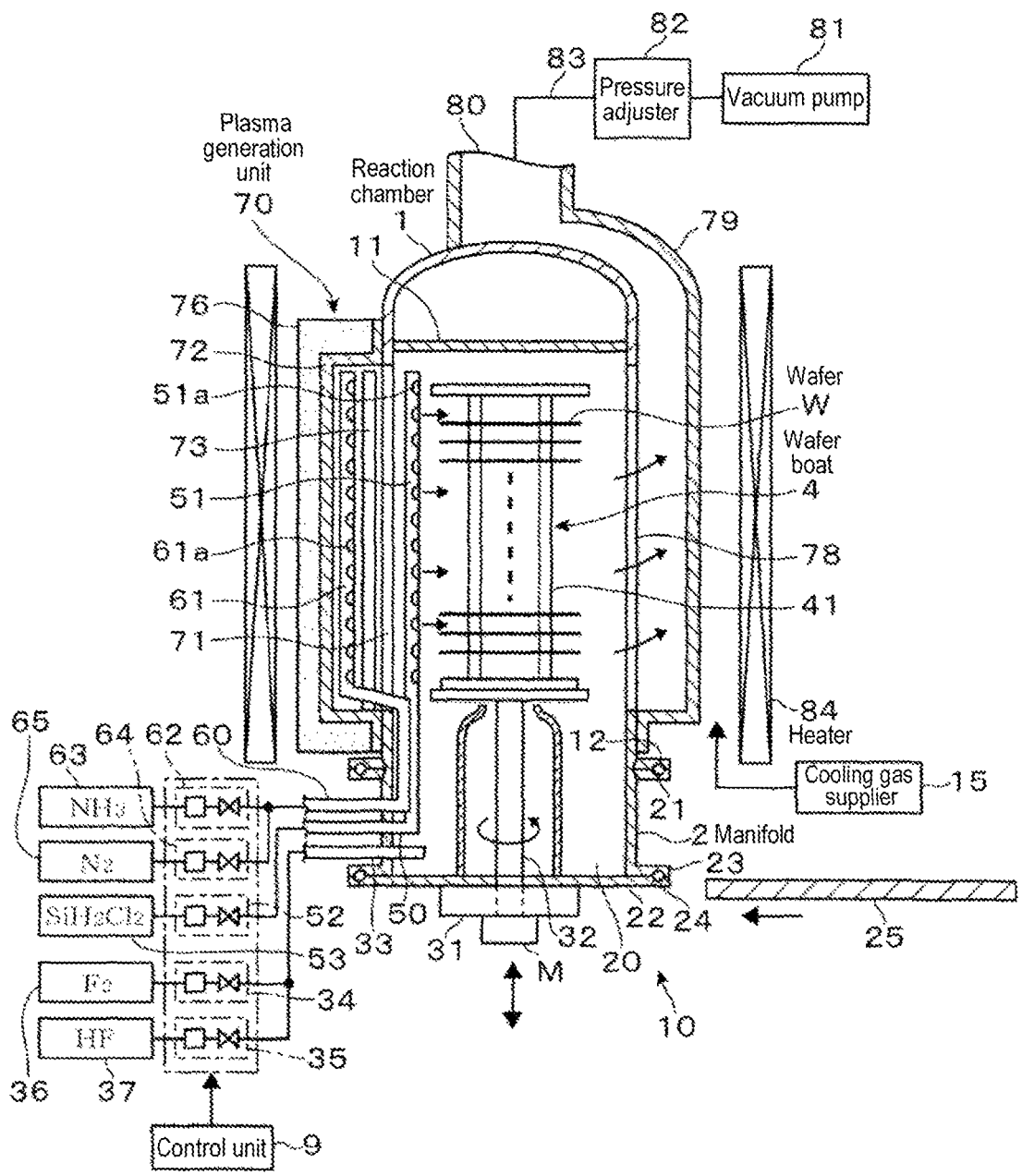
FIG. 1 is a longitudinal sectional side view of a vertical heat treatment apparatus.
Figure 2:
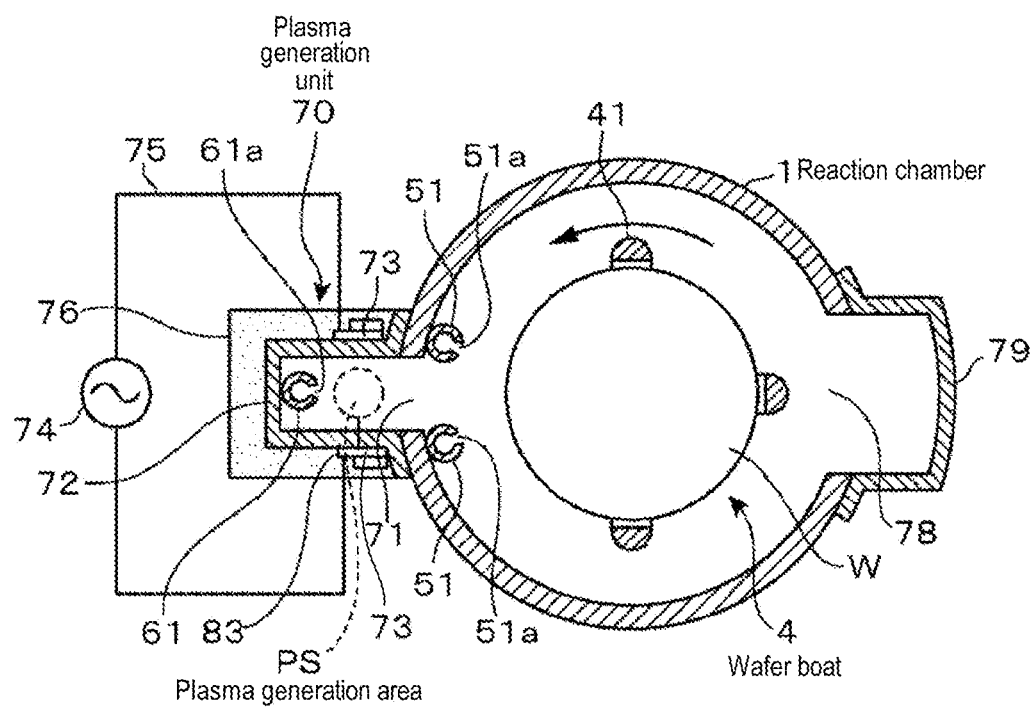
FIG. 2 is a transverse sectional plan view of the vertical heat treatment apparatus.

FIGS. 1 and 2 are schematic longitudinal and transverse sectional views of a vertical heat treatment apparatus 10 according to the present disclosure, respectively. The vertical heat treatment apparatus 10 is configured to form silicon nitride films (hereinafter, referred to as SiN films) on surfaces of wafers W by ALD (atomic layer deposition). Reference numeral 1 in FIGS. 1 and 2 designates a reaction chamber (treatment chamber), which, for example, is formed of quartz in the shape of a vertical cylinder. A ceiling of the reaction chamber 1 is sealed with a ceiling plate 11 made of quartz. In addition, a peripheral portion of a lower end opening of the reaction chamber 1 is formed integrally with a flange 12, and a manifold 2, which, for example, is formed of stainless steel in the shape of a cylinder, is connected to a lower surface of the flange 12 via a sealing member 21 such as an O-ring.

A lower end of the manifold 2 is open as a loading outlet (furnace opening), and a peripheral portion of an opening 20 thereof is formed integrally with a flange 23. In the lower portion of the manifold 2, a lid 22, e.g., made of quartz, which airtightly closes the opening 20 via a sealing member 24 such as an O-ring on the lower surface of the flange 23, is provided to be openable/closeable in the vertical direction by a boat elevator 31. A rotating shaft 32 is provided to penetrate a central portion of the lid 22, and a wafer boat 4 configured as a substrate holding unit is mounted on the upper end of the rotating shaft 32. The wafer boat 4 may be made of, for example, quartz. Reference numeral 41 designates posts configuring the wafer boat 4. Reference symbol M designates a rotating unit configured to rotate the wafer boat 4 through the rotating shaft 32.

An L-shaped first raw material gas supply pipe 50 is inserted through a sidewall of the manifold 2. At the distal end of the first raw material gas supply pipe 50, as shown in FIG. 2, two first raw material gas supply nozzles 51, each of which is a quartz pipe extending upward in the reaction chamber 1, are disposed while a long and narrow opening 71 of a plasma generation unit 70 described in detail later is disposed therebetween. A plurality (large number) of gas ejection holes 51a are formed at predetermined intervals in each of the first raw material gas supply nozzles 51 along its lengthwise direction. Gas may be approximately uniformly ejected from the respective gas ejection holes 51a in the horizontal direction. In addition, a supply source 53 of a silane-based gas, which is a first raw material gas, such as DCS ($SiH_2Cl_2$: dichlorosilane) gas, is connected to a base end side of the first raw material gas supply pipe 50 via a supply device group 52.

Also, an L-shaped second raw material gas supply pipe 60 is inserted through the sidewall of the manifold 2. At the distal end of the second raw material gas supply pipe 60, a second raw material gas supply nozzle 61 made of quartz, which extends upward in the reaction chamber 1, is bent on the way, and is provided in the plasma generation unit 70 described later. A plurality (large number) of gas ejection holes 61a are formed at predetermined intervals in the second raw material gas supply nozzle 61 along its lengthwise direction. Gas may be approximately uniformly ejected from the respective gas ejection holes 61a in the horizontal direction. In addition, a base end side of the second raw material gas supply pipe 60 is split into two parts, wherein a supply source 63 of $NH_3$ (ammonia) gas that is a second raw material gas is connected to the second raw material gas supply pipe 60 on one side via a supply device group 62, and a supply source 65 of $N_2$ (nitrogen) gas is connected to the second raw material gas supply pipe 60 on the other side via a supply device group 64.

In addition, one end of a cleaning gas supply pipe 33 is inserted through a sidewall of the manifold 2. The other end of the gas supply pipe 33 is split into two parts, which connect to a gas supply source 36 of $F_2$ (fluorine) gas and a gas supply source 37 of HF (hydrogen fluoride) via supply device groups 34 and 35, respectively. Thus, a mixed gas of $F_2$ and HF, as the cleaning gas, may be supplied into the reaction chamber 1. In addition, each of the supply device groups 34, 35, 52, 62 and 64 includes a valve, a flow rate adjusting unit, and the like.

Further, the plasma generation unit 70 is provided in a portion of the sidewall of the reaction chamber 1 along its height direction. The plasma generation unit 70 is configured in such a manner that the vertically long and narrow opening 71 is formed by cutting off a predetermined width of the sidewall of the reaction chamber 1 in the vertical direction and a vertically long and narrow compartment wall 72 (for example, made of quartz), which has a concave cross section, is airtightly welded on the outer wall of the reaction chamber 1 to cover the opening 71. The area surrounded by the compartment wall 72 is a plasma generation area PS. The opening 71 is formed to be vertically long enough to cover all the wafers W held by the wafer boat 4 in the height direction.

Also, a pair of long and narrow plasma electrodes 73 facing each other along the height direction thereof (vertical direction), are provided on outer surfaces of both sidewalls of the compartment wall 72. Reference numeral 74 designates a high frequency power source, reference numeral 75 designates a power feeding line, and reference numeral 76 designates an insulation protection cover.

Further, a long and narrow exhaust opening 78 is formed in the side of the reaction chamber 1 opposite to the plasma generation unit 70, for example, by cutting off the sidewall of the reaction chamber 1 in the vertical direction. An exhaust cover member 79 is provided at the exhaust opening 78 by welding. The exhaust cover member 79 is configured to extend upward along the sidewall of the reaction chamber 1 and to cover an upper side of the reaction chamber 1, and a gas outlet 80 is formed in a ceiling side of the exhaust cover member 79. An exhaust pipe 83 provided with a vacuum pump 81 and a pressure adjusting unit 82 configuring a vacuum exhaust unit is connected to the gas outlet 80.

As shown in FIG. 1, a heater 84 is provided to surround/interface with the outer circumference of the reaction chamber 1. In addition, a shutter 25 is provided below the reaction chamber 1 in order to cover the opening 20 when the wafer boat 4 is unloaded from the reaction chamber 1. Reference numeral 15 designates a cooling gas supply source configured to supply air, e.g., at room temperature, for cooling the reaction chamber 1 to a space between an inside of a wall portion not shown and the outside of the reaction chamber 1 and to the exhaust cover member 79.

The vertical heat treatment apparatus 10 includes a control unit 9, and the control unit 9 may be or includes, for example, a computer configured to control the boat elevator 31, the heater 84, the supply device groups 34, 35, 52, 62 and 64, the high frequency power source 74, the pressure adjusting unit 82, and the like. Further, the control unit 9 includes a memory part configured to store sequence programs for performing a series of later-described treatment steps carried out in the reaction chamber 1, a part for reading instructions of the respective programs to output control signals to the respective elements, and the like. In addition, the programs may be stored in the control unit 9, for example, in a recording medium such as a hard disk, a flexible disk, a compact disk, a magneto-optical (MO) disk, or a memory card.

Figure 3:
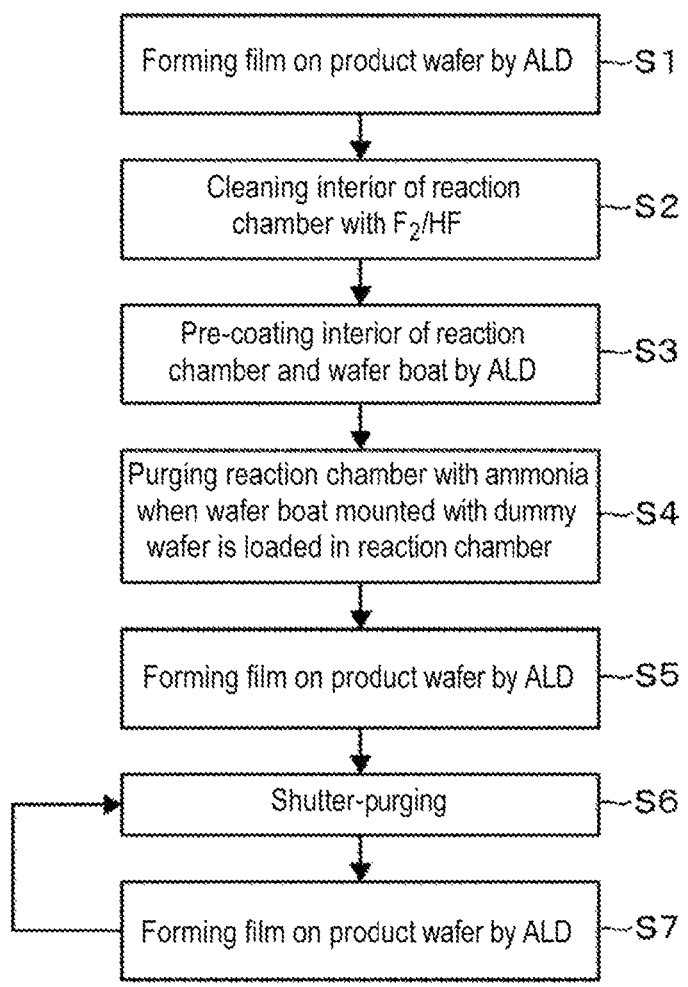
FIG. 3 is a flowchart of a treatment by the apparatus.

An example of a method of operating the vertical heat treatment apparatus 10 will be described with reference to FIG. 3 showing a flow of treatments performed during the operation. In a series of the treatments, product wafers W that are product substrates and dummy wafers W1 that are dummy substrates are used. The wafer W simply described indicates the product wafer. The dummy wafer W1 is made of semiconductor, such as silicon, for example, in the same way as the wafer W.

First, a plurality, e.g., 50, of the wafers W are mounted in the wafer boat 4 in the shape of shelves and loaded in the reaction chamber 1 from below, and the opening 20 is closed by the lid 22 to seal the reaction chamber 1. Then, the interior of the reaction chamber 1 is vacuumized at a pressure of, for example, 665.5 Pa (5 Torr), by the vacuum pump 81, while the interior of the reaction chamber is heated at a temperature of, for example, 500 degrees C.

Figure 4:
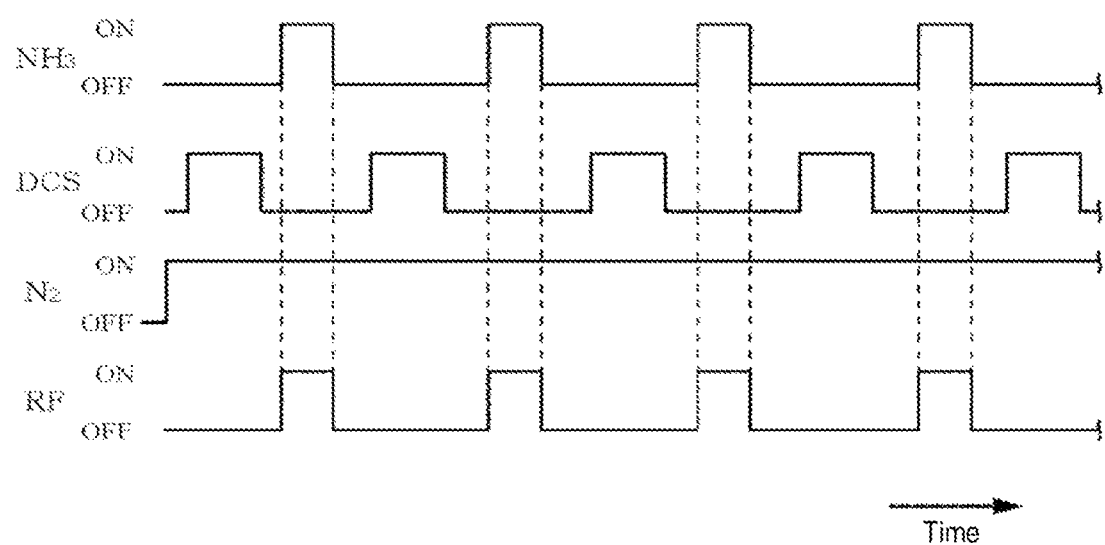
FIG. 4 is a timing diagram for gas supply in a film forming treatment process by the apparatus.

Thereafter, SiN films are formed on the wafers W by supplying the DCS gas, the $NH_3$ gas, and the $N_2$ gas. FIG. 4 is a timing diagram showing on/off timings for the supply of the respective gases and the high frequency power source 74 when the SiN film is formed. The DCS gas and the $N_2$ gas are supplied into the reaction chamber 1 through the first and second raw material gas supply nozzles 51 and 61 at, for example, flow rates of 1,000 sccm and 2,000 sccm for three seconds, respectively, while the high frequency power source 74 is turned off. Thus, molecules of the DCS gas are adsorbed onto a surface of each wafer W in the rotating wafer boat 4.

Thereafter, the supply of the DCS gas is stopped, and the $N_2$ gas is continuously supplied into the reaction chamber 1, while a pressure in the reaction chamber 1 is set to, for example, 120 Pa (0.9 Torr), so that the interior of the reaction chamber 1 is purged with the $N_2$ gas. Subsequently, the pressure in the reaction chamber 1 is set to, for example, 54 Pa (0.4 Torr), and the $NH_3$ gas and the $N_2$ gas are supplied into the reaction chamber 1 through the second raw material gas supply nozzle 61 at, for example, flow rates of 5,000 sccm and 2,000 sccm for one second, respectively, while the high frequency power source 74 is turned on. Thus, molecules of the respective gases in the reaction chamber 1 are ionized to generate plasma, and active species, such as N radicals, H radicals, NH radicals, $NH_2$ radicals, and $NH_3$ radicals, react with the molecules of the DCS gas on the surface of the wafer W to generate a silicon nitride. Thereafter, the supply of the $NH_3$ gas is stopped, and the $N_2$ gas is continuously supplied into the reaction chamber 1 while the pressure in the reaction chamber 1 is set to, for example, 106 Pa (0.8 Torr), so that the interior of the reaction chamber 1 is purged with the $N_2$ gas.

Such cycle is repeated a plurality of times, for example, 200 times. Thus, thin SiN films are laminated and grown on the surface of the wafer W layer by layer, and the SiN film having a desired thickness is formed on the surface of the wafer W (Step S1). After the process is terminated, the wafer boat 4 is unloaded from the reaction chamber 1. Then, if the accumulated film thickness of the SiN films after cleaning the interior of the reaction chamber 1 (i.e., a sum of thicknesses of the films formed in the respective batch treatments) exceeds a predetermined specified value, for example, 0.4 μm, the cleaning is performed again. The cleaning is performed as follows.

First, the wafer boat 4 is loaded into the reaction chamber 1 with no wafer W mounted therein, and the opening 20 is closed by the lid 22. Then, the interior of the reaction chamber 1 is vacuumized, so that the pressure in the reaction chamber 1 is set to a predetermined pressure while the temperature in the reaction chamber 1 is set to, for example, 350 degrees C. Then, the above-described cleaning gas including $F_2$ and HF is supplied into the reaction chamber 1 through the cleaning gas supply pipe 33. Thus, the SiN film formed on the interior of the reaction chamber 1 and the wafer boat 4 is etched to be removed from the reaction chamber 1 through an exhaust flow (Step S2). Thereafter, the supply of the cleaning gas is stopped, and the cleaning of the interior of the reaction chamber 1 is terminated. When the cleaning is terminated, the interior of the reaction chamber 1 and the wafer boat 4 are positively charged. Particularly, a lower side of the wafer boat 4 is highly charged. It is understood that no plasma is generated when the cleaning is performed, but the surface of the SiN film is positively charged when the SiN film is etched, and positive charges remain on surfaces of objects made of quartz when the SiN film is removed.

Subsequently, the inside of the reaction chamber 1 is set to a predetermined pressure and set to a temperature of, for example, 630 degrees C. In addition, the cycle described in Step S1 is repeated a predetermined number of times, thereby forming a SiN film having a film thickness of, for example, 500 Å, on the inner surface of the reaction chamber 1 and the surface of the wafer boat 4. Such a process, referred to as a pre-coating (Step S3), is performed so that the SiN film may be formed on the reaction chamber 1 and the wafer boat 4 in advance to stabilize a treatment atmosphere for the wafers W which are treated in succession, thereby suppressing a change in treatments among batches (among groups of the wafers W held by the wafer boat 4 at respective times)

Before the subsequent Step S4 is described, a difference between the film forming treatment in Step S1 and the pre-coating in Step S3 will be described now. Since the plasma is generated in Step S1, positive charges are collected on the inner surface of the reaction chamber 1 and the surface of the wafer boat 4, thus charging the surfaces. Also, in Step S1, the positive charges of the wafer boat 4 move directly to the surfaces of the wafers W, and the positive charges of the inner surface of the reaction chamber 1 also move to the surfaces of the wafers W through the plasma. Since the wafers W are made of semiconductor, charges may move inside the wafers W. That is, negative charges move inside the wafers W to neutralize the positive charges moved from the reaction chamber 1 and the wafer boat 4 to the surfaces of the wafers W. Thus, after the film forming treatment in Step S1 is terminated, the inner surface of the reaction chamber 1 and the surface of the wafer boat 4 are restrained from being positively charged. However, since no wafer W is mounted in the wafer boat 4 when the pre-coating of Step S3 is performed, the positive charges do not move to the wafers W. Thus, a large number of positive charges are accumulated on the inner surface of the reaction chamber 1 and the surface of the wafer boat 4.

FIGS. 5A to 5C are schematic views of a case in which the same film forming treatment as in Step S1 is performed on the wafers W when the positive charges are so accumulated. As described in Step S1, the wafers W are mounted in the wafer boat 4 and loaded into the reaction chamber 1 (FIG. 5A). As the wafers W are mounted, the positive charges accumulated on the wafer boat 4 move to the wafers W. Also, in order to form the film as described in Step S1, the plasma is generated in the reaction chamber 1. Then, the positive charges accumulated in the reaction chamber 1 move to the wafers W through the plasma. Since the positive charges accumulated in the wafer boat 4 and the reaction chamber 1 are relatively large, all of them cannot be neutralized in the wafers W, and the surfaces of the wafers W are positively charged (FIG. 5B).

While the surfaces of the wafers W are positively charged as described above, the particles present in the plasma are negatively charged. This is because a mean free path of electrons in the plasma is remarkably larger than that of positive ions, and thus, a collision probability between the electrons and the particles is high. Such negatively-charged particles 100 as above (see FIG. 5C) are pulled close to the surfaces of the positively charged wafers W and attached thereto. For this reason, particle contamination may occur in the wafers W of the lot on which the film forming treatment is first performed after the cleaning and the pre-coating.

The flowchart of FIG. 3 will be referred to again. In addition, reference to FIGS. 6A to 6D will also be made, which is a schematic view showing a state in the reaction chamber 1 when the treatment is performed according to the flowchart shown in FIG. 3. After the pre-coating of Step S3 of FIG. 3 is terminated, the lid 22 is lowered to open the opening 20, and the reaction chamber 1 is opened. Then, a large number of the dummy wafers W1 instead of the wafers W are mounted like shelves in the wafer boat 4 by a transfer unit not shown in the same manner as the wafers W. As described above, since the dummy wafers W1 are also made of semiconductor, the positive charges on the surface of the wafer boat 4 move to the dummy wafers W1 and are neutralized by the negative charges moving inside the dummy wafers W 1.

Subsequently, the wafer boat 4 is loaded into the reaction chamber 1 from below, the opening 20 is closed by the lid 22, and the reaction chamber 1 is sealed (referring to FIG. 6A). Then, the reaction chamber 1 is vacuumized up to a predetermined pressure by the vacuum pump 81, and the temperature in the reaction chamber 1 is set to, for example, 500 degrees C.

The $NH_3$ gas is supplied into the reaction chamber 1 through the second raw material gas supply nozzle 61 at a predetermined flow rate, for example, for one second, while the high frequency power source 74 is turned on. Thus, the $NH_3$ is ionized, and the plasma is generated in the reaction chamber 1. The positive charge accumulated in the reaction chamber 1 move to the dummy wafers W1 through the plasma and are neutralized by the negative charges moving inside the dummy wafers W1 (referring to FIG. 6B). In addition, the positive charges on the surface of the wafer boat 4 generated by the plasma also move to the dummy wafers W1 and are neutralized. Thereafter, for example, for one second, the supply of the $NH_3$ gas is stopped and the high frequency power source 74 is turned off.

Figure 7:
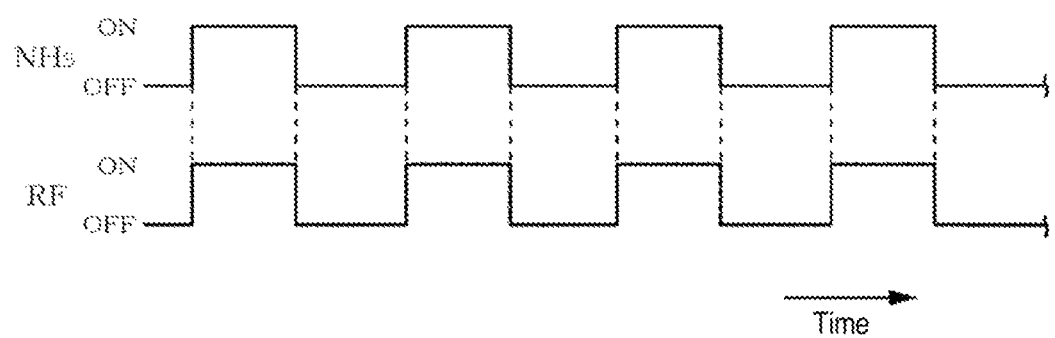
FIG. 7 is a timing diagram for gas supply in a process of eliminating charges by the apparatus.

FIG. 7 is a timing diagram showing on/off timings for the gas supply and the high frequency power source 74 when the wafer boat 4 mounted with the dummy wafers W1 is loaded as described above. As shown in FIG. 7, a cycle including the $NH_3$ gas supply in the on state of the high frequency power source 74 and the stop of the $NH_3$ gas supply in the off state of the high frequency power source 74 is repeatedly performed, and charge-elimination is performed in the reaction chamber 1. While the cycle is performed, the particles are negatively charged by the plasma as described above. When positive charges are oversupplied to the dummy wafers W1 and the dummy wafers W1 are positively charged, the particles are pulled close to the dummy wafers W1 and attached thereto (referring to Step S4 of FIG. 3). Unlike Step S1, the supply of the DCS gas is not performed in Step S4, since Step S4 is not a step for forming a film.

If the cycle is repeated a predetermined number of times, for example, 100 times, the lid 22 is lowered, the reaction chamber 1 is opened, and the wafer boat 4 is unloaded therefrom. While being attached to the dummy wafers W1, the particles are removed from the interior of the reaction chamber 1. The dummy wafers W1 are unloaded from the wafer boat 4 by the wafer transfer unit. Instead, the wafers W are mounted in the wafer boat 4 as described in Step S1. Thereafter, the wafer boat 4 is loaded into the reaction chamber 1 (referring to FIG. 6C), and on/off of the supply of the various gases and the high frequency power source 74 is performed to form the SiN films on the wafers W according to the time diagram shown in FIG. 4 in the same manner as Step 1 (referring to Step S5 of FIG. 3).

Since the charges of the interior of the reaction chamber 1 and the wafer boat 4 are eliminated in Step S4, positive charges are restrained from moving to the wafers W through the plasma while the film forming treatment of Step S5 of FIG. 3 is performed, and the number of the positive charges moving from the wafer boat 4 to the wafers W is also reduced when the wafers W are mounted in the wafer boat 4. That is, the wafers W are restrained from being positively charged. Thus, although the particles in the plasma are negatively charged, the particles are restrained from being pulled and attached to the wafers W. In addition, since the particles in the reaction chamber 1 are removed in Step S4, the number of particles around the wafers W is reduced during the film formation. This also restrains the particles from being attached to the wafers W (referring to FIG. 6D). When the SiN film is formed to have a desired film thickness, the wafer boat 4 is unloaded as described above, and the opening 20 is closed by the shutter 25.

Subsequently, the temperature in the reaction chamber 1 is set to, for example, 800 degrees C. and the $NH_3$ gas is supplied into the reaction chamber 1 through the second raw material gas supply nozzle 61 to set a partial pressure of the $NH_3$ gas to, for example, 16,000 Pa (120 Torr). For a predetermined time, this state is maintained to purge the interior of the reaction chamber 1. The purge is performed to nitride a silicon-rich film with a low content of nitrogen and a high content of silicon for the SiN film attached to the interior of the reaction chamber 1 and the wafer boat 4 during the film forming treatment of Step S5 of FIG. 3.

Thereafter, a cooling gas is supplied to a space around the reaction chamber 1 from the cooling gas supply source 15, and the space is exhausted. Then, the temperature in the reaction chamber 1 is rapidly dropped from 800 degrees C. to, for example, 250 degrees C., and the pressure in the reaction chamber 1 is set to, for example, 1.33 Pa (0.01 Torr). The reaction chamber 1 is rapidly cooled as described above, so that a difference in thermal contraction between the SiN film attached to the interior of the reaction chamber 1 and the reaction chamber 1 including quartz causes stress to be applied to the SiN film, thereby resulting in cracks. Thus, the SiN film is peeled off and then removed from the reaction chamber 1 (Step S6 of FIG. 3).

The SiN film is removed in a state where the shutter 25 is closed (shutter purge), and in parallel thereto, the wafers W having the SiN films formed thereon are unloaded from the wafer boat 4 in Step S6 of FIG. 3, and the wafers W, on which the film forming treatment will be performed next, are transferred and mounted to the wafer boat 4. If the supply of the cooling gas is stopped and the shutter 25 is opened, the wafer boat 4 is loaded into the reaction chamber 1 and the film forming treatment is performed in the same way as Steps S1 and S5 (referring to Step S7 of FIG. 3). After the film forming treatment is terminated, the purge step (Step S6) is performed, and after the purge is terminated, the film forming treatment step (Step S7) is performed again. The purge of Step S6 and the film forming treatment of Step S7 are repeatedly performed in this way, and if the accumulated film thickness exceeds a specific value, the steps after Step S2 are performed. In addition, performing the shutter purge is not necessary.

According to the vertical heat treatment apparatus 10, after the cleaning and the pre-coating are performed in the interior of the reaction chamber 1, the wafer boat 4 is mounted with the dummy wafers W1 and loaded into the reaction chamber 1. Then, $NH_3$ gas is supplied into the reaction chamber 1 and converted to plasma. Thus, the positive charges of the interior of the reaction chamber 1 and the wafer boat 4 move to the dummy wafers W1, so that the dummy wafers W1 are positively charged and the particles present in the reaction chamber 1 are negatively charged by the plasma. As a result, the particles are attached to the dummy wafers W1. Thereafter, when the film forming treatment by ALD is performed on product wafers W, the positive charges of the interior of the reaction chamber 1 and the wafer boat 4 are reduced due to the movement to the dummy wafers W1, so that the number of positive charges moving to the wafers W is reduced. In addition, as the particles in the reaction chamber 1 are adsorbed onto the dummy wafers W1, the number of the particles is reduced. Thus, the particles are restrained from being attached to the wafers W. As the treatment is performed as shown in the flowchart of the embodiment of FIG. 3, the amount of attachment of particles is reduced in the lot of the wafers on which the film forming treatment is first performed after the reaction chamber 1 is cleaned.

In addition, the film forming treatment need not be performed on the dummy wafers W1 when utilizing such charge-elimination techniques as described above, and consequently the dummy wafers W1 can be repeatedly used. If the dummy wafers W1 are loaded into the reaction chamber 1 when the pre-coating is performed, and if films are to be formed on the dummy wafers W1, the lifespan of expensive dummy wafers W1 would be shortened and they could not be repeatedly used. However, if the film formation step is not performed on the dummy wafers W1 in the charge-elimination techniques described above, the dummy wafers W1 would be in a better condition to be reused and treatment costs could be reduced. Further, it takes time to form a film on the wafers W in the film forming treatment step to achieve a predetermined film thickness, depending on the thickness. However, there is no such time constraint on the time required for charge-elimination, and it will be appreciated that the time required for charge-elimination is shorter than the time required for the film forming treatment. Thus, although the charge-elimination step is performed, any decrease in throughput can be suppressed.

As described above, when the cleaning of the reaction chamber 1 is terminated, the number of positive charges in the reaction chamber 1 is increased as compared to before the cleaning is performed. Therefore, if this cleaning step is terminated and before the pre-coating is performed, the dummy wafers W1 may be loaded into the reaction chamber 1 and plasma may be generated. That is, in the above-described flow referring to FIG. 3, Step S2, Step S3, and Step S4 may be performed in an order: Step S2→Step S4→Step S3.

Step S4 which is the charge-elimination of the interior of the reaction chamber 1 is performed while generating plasma from the $NH_3$ gas by intermittently generating an electric field from the plasma electrodes 73. Although this is to suppress damage caused by the plasma in the reaction chamber 1, the treatment may be performed while the electric field is continuously generated. In addition, the plasma may be intermittently generated by allowing the $NH_3$ gas to flow into the reaction chamber 1 continuously.

Although the $NH_3$ gas as a second gas for nitriding the molecules of a first gas adsorbed onto the wafers W is used in the above-described example, a gas for oxidizing the adsorbed molecules, for example, ozone gas, may be used. When the second gas is such an oxidizing gas, a variety of gases other than dichlorosilane may be used as the first gas. For example, the first gas may include HCD [hexachlorodisilane], TMA [trimethylaluminium], 3DMAS [trisdimethylaminosilane], TEMAZ [tetrakisethylmethylaminozirconium], TEMAH [tetrakisethylmethylaminohafnium], $Sr(THD)_2$ [strontium bis-tetramethylheptanedionate], $Ti(MPD)(THD)_2$ [titanium methylpentanedionatobistetramethylheptanedionate], diisopropylaminosilane (DIPAS), and the like.

In various embodiments described previously, a semiconductor substrate is used as the dummy wafer W1. The semiconductor substrate may be made of, for example, GaAs (gallium arsenide) or the like, other than Si. However, if conductors are used instead of the dummy wafers W1 for the dummy substrates, negative charges may also move inside the conductors. Thus, the same effects as in the case of using the dummy wafers W1 may be obtained. In order to prevent metal contamination in the apparatus 10, the conductors may be made of, for example, carbon.

The present inventors assume that the interior of the reaction chamber after the cleaning is positively charged, that the pre-coating further increases the charges, and when plasma is generated thereafter, the charges move from the reaction chamber to the semiconductor substrates to cause particle contamination. For this reason, after the cleaning process is performed and before the film forming treatment is performed on product semiconductor substrates, the reaction gas is supplied into the reaction chamber without supplying the raw material gas into the reaction chamber, and plasma is generated from the reaction gas, in a state where dummy semiconductor or conductor substrates are loaded into the reaction chamber. Thus, positive charges in the reaction chamber move to the dummy substrates through the plasma. Further, since the particles generated by the cleaning are negatively charged, the particles move to the dummy substrates. Therefore, the number of particles in the reaction chamber is reduced. As a result, when the film forming treatment on subsequent product semiconductor substrates is performed, the particles attached to the semiconductor substrates are decreased. Further, since the process of eliminating charges does not involve film formation, the dummy substrates may be reused and the time required for the process can also be shortened.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of operating a vertical heat treatment apparatus, the vertical heat treatment apparatus including a first gas nozzle configured to supply a first gas, which is a raw material gas, and a second gas nozzle configured to supply a second gas, which is a reaction gas reacting with molecules of the first gas to produce a reaction product, the method comprising:
   cleaning an interior of a vertical reaction chamber by supplying a cleaning gas into the reaction chamber, the reaction chamber being configured to interface with a heating unit;
   pre-coating the interior of the reaction chamber with a thin film after cleaning the interior of the vertical reaction chamber by performing, a plurality of times, a cycle including alternately supplying the first gas into the reaction chamber through the first gas nozzle and supplying the second gas into the reaction chamber through the second gas nozzle while generating plasma from the second gas;
   eliminating charges, after cleaning the interior of the vertical reaction chamber and separately from the pre-coating, by loading a substrate holding unit in which a dummy semiconductor substrate or a conductive substrate is held into the reaction chamber, stopping supply of the first gas, and periodically supplying the second gas into the reaction chamber through the second gas nozzle while generating plasma from the second gas;
   loading the substrate holding unit in which a plurality of product semiconductor substrates are held into the reaction chamber, after pre-coating the interior of the reaction chamber and eliminating the charges; and
   forming a thin film in the reaction chamber after loading the substrate holding unit by performing, a plurality of times, a cycle including alternately supplying the first gas into the reaction chamber through the first gas nozzle and supplying the second gas into the reaction chamber through the second gas nozzle while generating plasma from the second gas.

2. The method of claim 1, wherein generating plasma from the second gas after loading the dummy semiconductor substrate or the conductive substrate in the reaction chamber is performed by intermittently generating an electric field from plasma electrodes.

3. The method of claim 1, wherein eliminating the charges is performed after pre-coating the interior of the reaction chamber.

4. The method of claim 1, wherein the first gas is a silane-based gas, and the second gas is an ammonia gas.

* * * * *